(12) United States Patent
Fenouillet-Beranger et al.

(10) Patent No.: US 10,199,276 B2
(45) Date of Patent: Feb. 5, 2019

(54) SEMICONDUCTOR AND METAL ALLOY INTERCONNECTIONS FOR A 3D CIRCUIT

(71) Applicant: Commissariat a L'Energie Atomique et aux Energies Alternatives, Paris (FR)

(72) Inventors: Claire Fenouillet-Beranger, Voiron (FR); Fabrice Nemouchi, Moirans (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/335,092

(22) Filed: Oct. 26, 2016

(65) Prior Publication Data
US 2017/0117186 A1 Apr. 27, 2017

(30) Foreign Application Priority Data
Oct. 27, 2015 (FR) ...................... 15 60243

(51) Int. Cl.
| H01L 23/535 | (2006.01) |
| H01L 21/822 | (2006.01) |
| H01L 21/768 | (2006.01) |
| H01L 27/06  | (2006.01) |

(52) U.S. Cl.
CPC ...... *H01L 21/8221* (2013.01); *H01L 21/7684* (2013.01); *H01L 21/76802* (2013.01); *H01L 21/76847* (2013.01); *H01L 21/76879* (2013.01); *H01L 21/76886* (2013.01); *H01L 21/76889* (2013.01); *H01L 27/0688* (2013.01)

(58) Field of Classification Search
CPC .................................................. H01L 23/535
See application file for complete search history.

(56) References Cited

U.S. PATENT DOCUMENTS

| 4,902,637 A   | 2/1990  | Kondou et al.          |
| 6,780,739 B1  | 8/2004  | Mao et al.             |
| 7,804,134 B2  | 9/2010  | Coronel et al.         |
| 8,916,435 B2* | 12/2014 | Li .......... H01L 21/84 |
|               |         | 257/E21.651            |

(Continued)

FOREIGN PATENT DOCUMENTS

EP        3 002 688 A1      8/2014

OTHER PUBLICATIONS

French Preliminary Search Report dated Sep. 6, 2016 in French Application 15 60243 filed on Oct. 27, 2015 (with English Translation of Categories of Cited Documents).

(Continued)

*Primary Examiner* — Mohammad Choudhry
(74) *Attorney, Agent, or Firm* — Oblon, McClelland, Maier & Neustadt, L.L.P.

(57) ABSTRACT

Fabrication of an integrated circuit comprising:
at least one first transistor made at least partially in a first semiconducting layer,
at least one second transistor made at least partially in a second semiconducting layer formed above the first semiconducting layer,
an insulating layer formed between the first transistor and the second transistor, one or several connection elements passing through the insulating layer between the first and the second transistor,
at least one connection element being connected to the first and/or the second transistor and being based on a metal-semiconductor alloy.

20 Claims, 12 Drawing Sheets

(56) References Cited

U.S. PATENT DOCUMENTS

| | | |
|---|---|---|
| 2002/0119640 A1 | 8/2002 | Gonzalez |
| 2006/0197117 A1 | 9/2006 | Kim et al. |
| 2009/0218640 A1 | 9/2009 | Hampp |
| 2014/0043094 A1* | 2/2014 | Yamazaki .............. H03K 3/012 327/437 |

OTHER PUBLICATIONS

Kevin L. Lin, et al., "Nickel Silicide for Interconnects", IEEE, 2015, 3 pgs.
Wen Yan, et al., "Effects of grain boundaries on electrical property of copper wires", Trans. Nonferrous Met. Soc. China, vol. 13, (5), 2003, 5 pgs.
U.S. Appl. No. 14/887,831, filed Oct. 20, 2015, 2016/0111330 A1, Claire Fenouillet-Beranger, et al.
U.S. Appl. No. 15/176,716, filed Jun. 8, 2016, Claire Fenouillet-Beranger, et al.
U.S. Appl. No. 15/184,076, filed Jun. 16, 2016, Claire Fenouillet-Beranger, et al.
U.S. Appl. No. 15/234,240, filed Aug. 11, 2016, Philippe Rodriguez, et al.

* cited by examiner

SEMICONDUCTOR AND METAL ALLOY INTERCONNECTIONS FOR A 3D CIRCUIT

TECHNICAL DOMAIN

This application relates to the domain of integrated circuits containing components distributed on several levels, and particularly superposed transistors.

Such devices are usually qualified as being 3-dimensional or "3D" integrated circuits.

PRIOR ART

In general, in the field of integrated circuits, there is an ongoing attempt to increase the density of transistors.

One solution to achieve this consists of distributing transistors on several levels of superposed semiconducting layers. Such circuits usually also comprise at least two superposed semiconducting layers separated from each other by at least one insulating layer.

Interconnection elements passing through this insulating layer may be provided to connect the different transistor levels to each other.

Fabrication of the stage(s) on higher levels may be limited by thermal budget constraints.

For example, in some cases it is required to limit the thermal budget to 500° C.

Interconnection elements are usually based on a metal such as W.

However, the electrical conduction properties of these elements can be affected when their temperature is increased above a certain limit, for example more than 400° C.-500° C.

Therefore the problem arises of finding a new method of making interconnections for a 3D integrated circuit with better performance regarding the above-mentioned disadvantage(s), and particularly with relaxed thermal budget constraints.

PRESENTATION OF THE INVENTION

According to one aspect, this invention relates to a method of making one or several connection elements for an integrated circuit with superposed component levels, comprising steps consisting of:
- make at least one opening passing through an insulating layer above a first component made at least partially in a first semiconducting layer,
- fill in the opening with a semiconducting material so as to form at least one element based on a semiconducting material passing through the insulating layer,
- deposit a metallic layer on the element and perform at least one thermal annealing so as to form a connection element made of an alloy of the metal and the semiconducting material.

With such a method, it is thus possible to form an element based on a semiconducting material on which one or several steps in the method for which a given thermal budget is required can be carried out, then transform this semiconducting element into a connection element based on a metal-semiconductor alloy before performing one or several other steps requiring a lower thermal budget.

This can thus avoid damaging the connection element by exposing it to high temperatures only when it is based on a semiconductor.

The fabrication of a connection element based on an alloy made of a metallic material and a semiconducting material can be compatible with methods requiring a low thermal budget, particularly when the alloy made of the metallic material and the semiconducting material is NiSi or $CoSi_2$.

More particularly, this invention relates to a method of making one or several connection elements for an integrated circuit with superposed transistor levels, comprising steps to:

a) fabricate one or several openings passing through a stack comprising at least one insulating layer above a first transistor on a given level of transistor(s), the first transistor being provided with a channel region located in a first semiconducting layer, b) fill in the opening(s) with a semiconducting material so as to form one or several elements based on a semiconducting material passing through the insulating layer, c) form a second semiconducting layer on the stack and at least partially a second transistor of another level of transistor(s) higher than the given level, the second semiconducting layer being suitable for holding a second transistor channel region, then, d) form at least one access well to at least one element among the one or several elements based on a semiconducting material, e) deposit a metallic material in the access well and perform thermal annealing so as to form a metal-semiconductor alloy starting from said semiconducting material and said metallic material, and thus transform said element into a connection element based on a metal-semiconductor alloy.

Thus, with such a method it is possible to perform one or several steps requiring a high thermal budget, and then to transform the semiconducting element(s) into connection elements based on a metal-semiconductor alloy after this step with a given thermal budget has been completed.

With such a method it is possible to make one or several connection elements between superposed transistor levels while using a limited thermal budget, particularly when the metal-semiconductor alloy is NiSi.

The critical dimension of elements based on a semiconductor material that are transformed into elements based on a metal-semiconductor alloy can be less than a few tens of nanometers, particularly less than 50 nm so that the dimensions can be small while having connection elements with a low resistivity.

Advantageously, the critical dimension of the element(s) formed in step c) is less than 20 nm, and preferably less than 10 nm.

This makes it possible to form connection elements with a lower resistivity than connection elements with equivalent dimensions made of copper, particular when the alloy is based on Nickel and Silicon.

For the purposes of this description, the "critical dimension" of an element is its smallest dimension other than its thickness.

According to one possible embodiment, the method may also include a step in which a conducting barrier layer is formed coating the bottom of the opening(s), before step c) in which the opening(s) is (are) formed.

Such a barrier layer is configured so as to prevent diffusion of a metal-semiconductor alloy during step e) or subsequent steps, and particularly to prevent propagation of a metal-semiconductor alloy towards one or several semiconducting regions in contact with which elements are formed.

Such a barrier layer can be formed between step a) and step b) so as to cover the bottom of the opening(s), without entirely coating the lateral walls of the openings that extend between the bottom and their outlet.

Such a deposit, for example made by PVD, can avoid damage to the silicide in the source and drain regions of transistors on the given level. Such a method can also create connection elements with a lower resistivity while inducing fewer mechanical constraints.

According to one possible embodiment of the method, at least one opening made in step a) comprises a bottom exposing a metal pad, this metal pad being placed on at least one region of the first transistor and/or the first semiconducting layer.

Such a metal pad can be configured to prevent diffusion of the metal-semiconductor alloy towards this region.

According to one possible embodiment of this method, at least one opening made in step a) comprises a vertical portion communicating with a horizontal portion extending parallel to the first semiconducting layer.

Thus, a semiconducting element comprising a vertical portion and a horizontal portion can be formed at the same time in the filling step b).

According to one possible embodiment, step d) may including the formation of at least one access well to a transistor gate made of a semiconducting material, step e) comprising the deposition of metallic material on the gate and the transformation of at least one portion of the gate into a metal-semiconductor alloy.

A gate based on a metal-semiconductor alloy can thus be formed at the same time as one or several connection elements based on a metal-semiconductor alloy.

Advantageously, the semiconducting filler material in step b) is a low density semiconducting material. In this description, low density refers to a density less than the nominal density of the solid semiconducting material considered (bulk density).

During formation of the alloy in step e), metal is incorporated into the semiconducting material, which can cause a volume increase in a confined medium. The fact that a "low density" semiconducting material is used can limit this increase and stresses induced by this increase.

The metal-semiconductor alloy based on which connection elements are formed may advantageously be based on Nickel and Silicon, and particularly Nickel monosilicide (NiSi) that has good electrical properties.

In particular, such an alloy has the advantage that it does not require a high formation temperature.

According to one particular embodiment, a block of doped semiconducting material or metal can be formed at the bottom of the access well by PVD, after step d) and before step e). Then in step e), the metallic material may be deposited on the block of doped semiconducting material or metal using another deposition technique, and particularly by the electroless method.

The result obtained is improved filling of the access well thus avoiding making unfilled holes in the connection elements.

A step in which the element(s) based on a semiconducting material are cleaned can be performed after step d) to form the access well and before step e) to deposit metallic material in the access well. Such a step may consist of deoxidising the elements.

The method may also include at least one CMP polishing step after step b) to fill the opening(s) with a semiconducting material and before step c).

This invention also relates to an integrated circuit obtained using a method like that defined above.

In particular, this invention relates to an integrated circuit comprising:

- at least one first transistor made at least partially in a first semiconducting layer,
- at least one second transistor made at least partially in a second semiconducting layer formed above the first semiconducting layer,
- an insulating layer formed between the first transistor and the second transistor,
- one or several connection elements passing through the insulating layer between the first transistor and the second transistor, at least one connection element being connected to the first and/or the second transistor and being based on a metal-semiconductor alloy.

BRIEF DESCRIPTION OF THE DRAWINGS

This invention will be better understood after reading the description of example embodiments given purely for information and that are in no way limitative with reference to the appended drawings on which.

The different parts shown on the figures are not necessarily all at the same scale, to make the figures more easily understandable.

Furthermore, in the following description, terms that are dependent on the orientation of the structure such as "vertical", "horizontal", "upper", "lower", "lateral" should be understood assuming that the structure is oriented as shown in the figures.

DETAILED PRESENTATION OF PARTICULAR EMBODIMENTS

An example method of making connection elements for a 3 dimensional integrated circuit will now be described with reference to FIGS. 1A-1G.

Figure 1A:
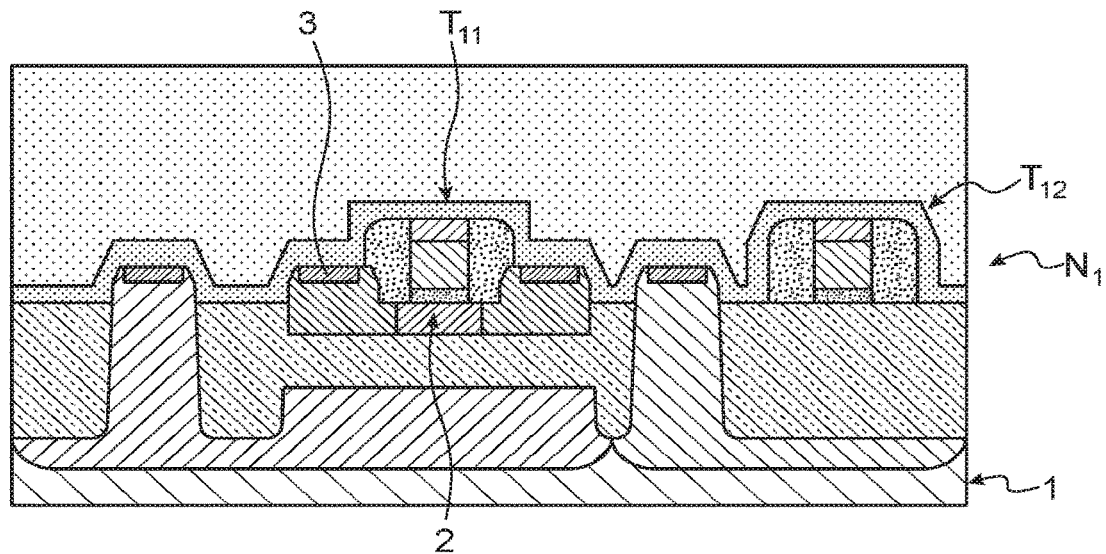
FIGS. 1A-1G illustrate an example embodiment of the method of making connection elements between different levels of transistors in a 3D integrated circuit in which the connection elements are formed from a semiconducting material that is subsequently silicided.

Refer firstly to FIG. 1A that illustrates a stage of the circuit, particularly the first level $N_1$, of a plurality of stages of electronic components distributed on 3 dimensions formed on a substrate 1.

This level $N_1$ is provided with one or several transistors $T_{11}, T_{12}$, for example of the MOS type, of which at least the channel region is formed in a semiconducting layer 2. Contact zones 3 based on metal-semiconductor alloy can be provided on the transistors $T_{11}, T_{12}$. The transistors $T_{11}, T_{12}$ are covered with at least one insulating layer 5. This insulating layer 5 is chosen to be based on a material for example such as $SiO_2$, preferably non-porous.

The next step is to form one or several openings 6 in the insulating layer 5 that will hold one or several elements each of which can make contact on a region of a transistor $T_{11}$, $T_{12}$ or on the semiconductor layer 2 on the first level $N_1$.

Figure 1B:
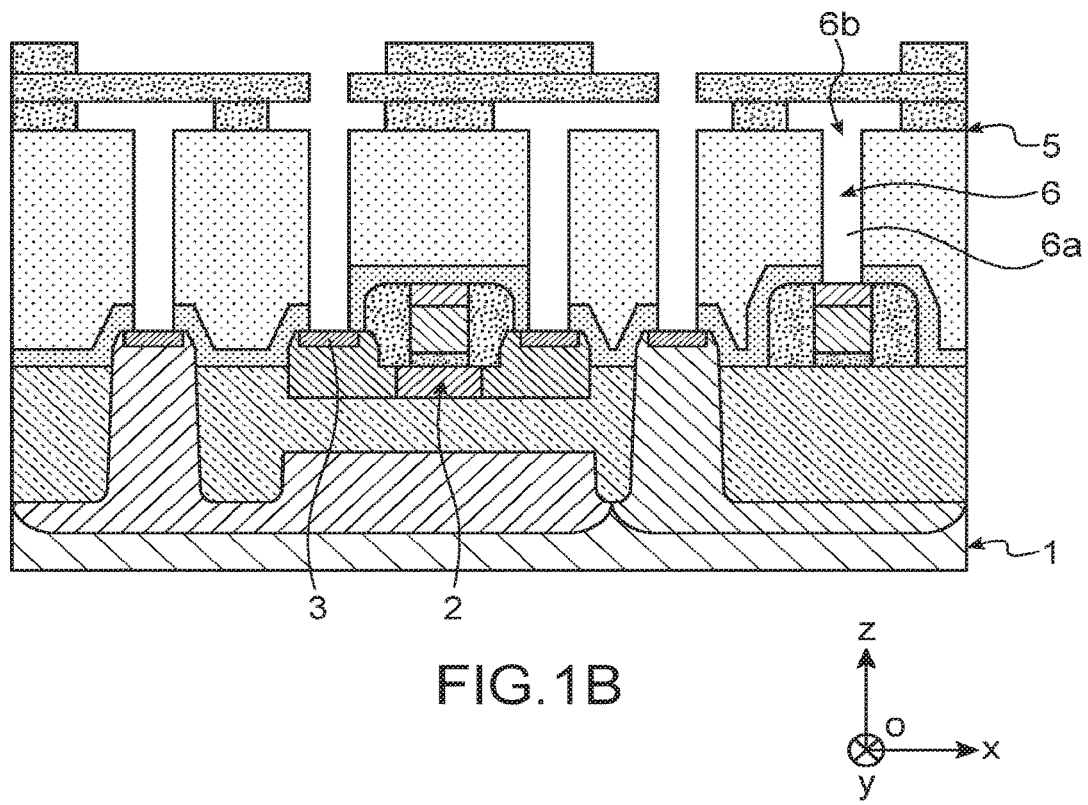

In the example embodiment illustrated on FIG. 1B, some openings 6 have at least one vertical portion 6a, in other words a portion that extends in a direction orthogonal to the semiconducting layer 2 and at least one horizontal portion 6b, in other words that extends parallel to the semiconducting layer 2. On FIG. 1B, the vertical direction corresponds to the direction of a vector z of an orthogonal coordinate system [O; x; y; z] while the horizontal direction is a direction parallel to the [O; x; y] plane.

The next step is to fill the openings 6 by a semiconducting material 8. The semiconducting material 8 may for example be polySi or polySiGe or amorphous Si or amorphous SiGe. Polysilicon has the advantage of being less dense than amorphous silicon.

Preferably, the semiconducting filling material is a low density amorphous material, in other words with a density lower than a nominal value that depends on the solid semiconducting material considered.

For example, when silicon with a nominal density $d_{Si}=2.33$ g/cm$^3$ is considered, the density of the semiconducting filler material may be $d_1$ such that $d_1 < d_{Si}$.

Considering filling with Germanium with nominal density $d_{Ge}=5.32$ g/cm$^3$, the filling preferably consists of a material based on Germanium with density $d_1$ such that $d_1 < d_{Ge}$. If filling is made using $Si_{1-x}Ge_x$, the density $d_1$ of the filling material is such that:

$$d_1 < (1-x) \times dSi + x \times dGe.$$

A planarisation step (CMP) may be done after filling so that the excess semiconducting material 8 can be removed.

Advantageously, the openings 6 may be filled in a single step, so that connection elements with a lower resistivity can be used.

Figure 1C:
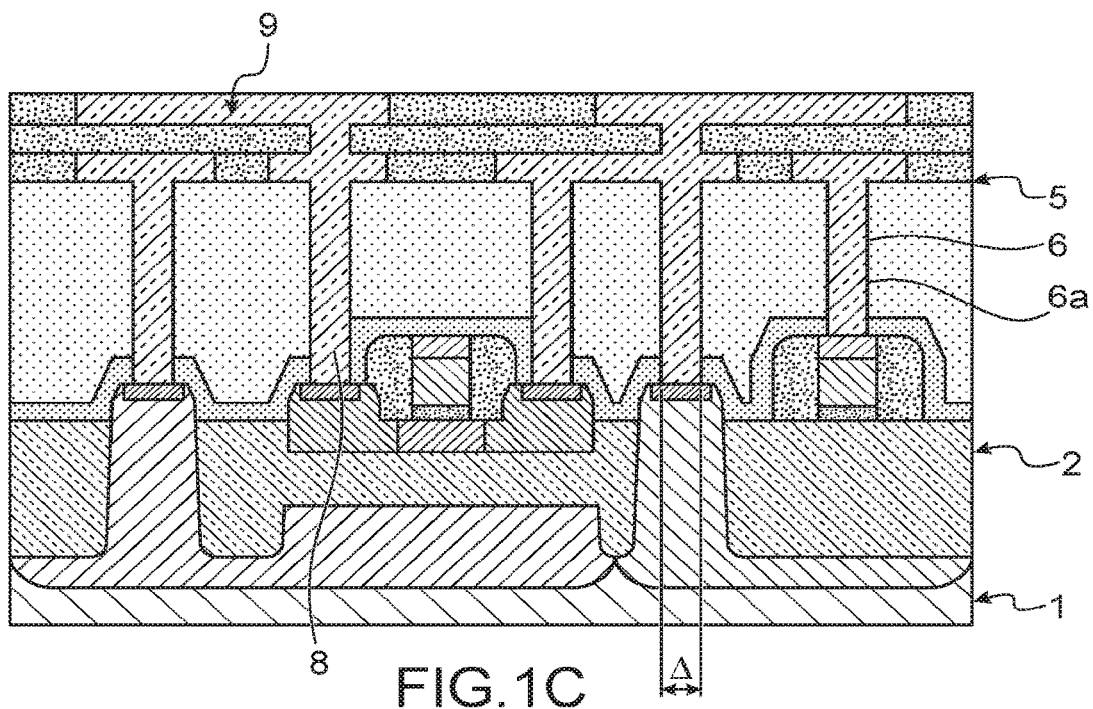

As a variant to the method illustrated on FIGS. 1B-1C, it would also be possible to perform this filling by repeating a sequence of steps one or several times, consisting of forming an insulating layer and then forming openings in the insulating layer, and then filling these openings with a semiconducting material.

The result obtained after filling is a structure composed of one or several elements 9 based on a semiconducting material 8 passing through at least one insulating layer 5 formed on the transistors $T_{11}, T_{12}$.

In particular, the critical dimension $\Delta$ of the elements 9 is less than 50 nm, advantageously less than 20 nm and preferably less than 10 nm.

The critical dimension $\Delta$ on FIG. 1C is the smallest dimension of the elements 9 measured parallel to the [O; x; y] plane.

In the particular example embodiment illustrated on FIG. 1C, the elements 9 are in contact with one or several corresponding regions of transistors $T_{11}, T_{12}$ on the first level $N_1$.

One or several additional insulating layers 15 can then be formed so as to cover the elements 9 based on a semiconducting material 8 and the insulating material 5.

The thickness of the additional insulating layer 15 may for example be between 50 nm and 120 nm thick.

The stack of insulating layers 5, 15 may be covered with a surface layer that will act as a bonding layer to make an assembly with a support. This surface layer may be based on a dielectric material such as $SiO_2$. The next step is to transfer a support including a semiconducting layer 22, for example by molecular bonding. This support may be provided with a dielectric layer, for example based on $SiO_2$, that is brought into contact with the surface layer covering the stack for bonding. According to one variant, a semiconducting layer 22 can be transferred directly onto the surface layer covering the stack.

The next step is to at least partially form a transistor $T_{21}$ on a higher level, particularly a second level $N_2$ of the 3D stack starting from the semiconducting layer 22.

Figure 1D:
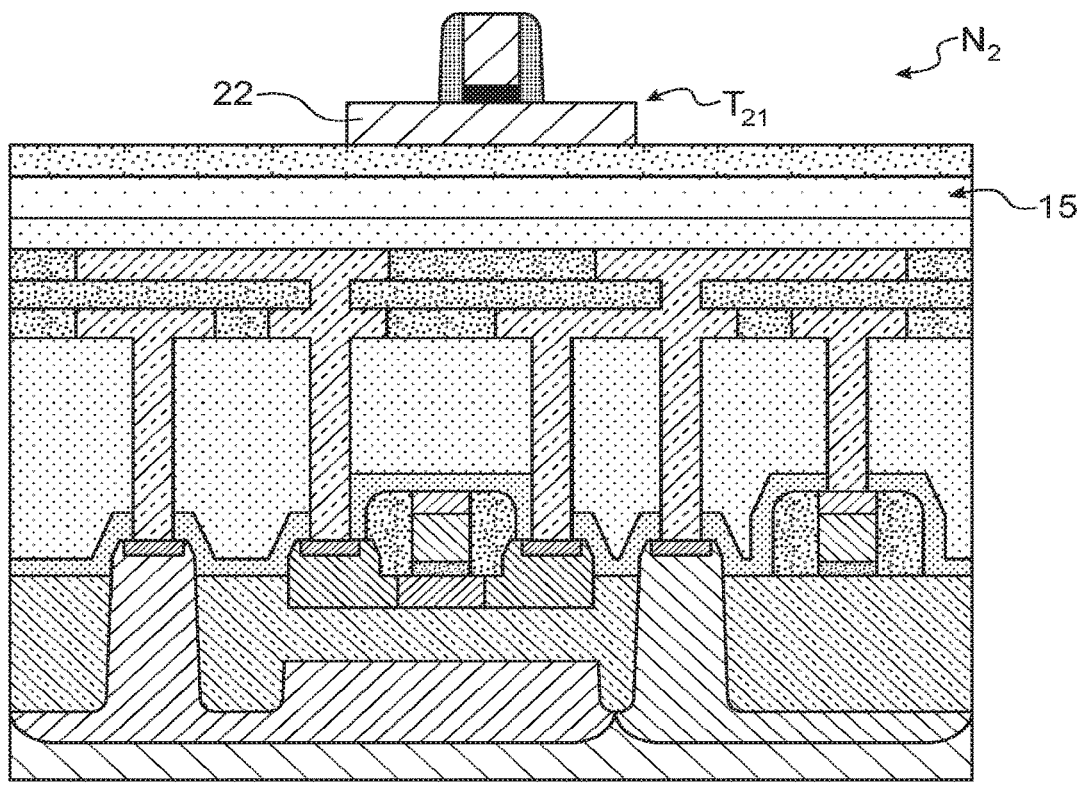

The transistor $T_{21}$ makes a channel region that extends in the semiconducting layer 22, with source and drain regions that can be at least partially formed in the semiconducting layer 22, and a gate dielectric and a gate formed on the semiconducting layer 22 (FIG. 1D).

In some cases, the formation of the transistor $T_{21}$ may include one or several treatment steps requiring a high thermal budget.

The elements 9 based on a semiconducting material are not necessarily damaged or are less damaged than if they were made of metal. "Damage" for example means that the structure of a metallic element, particularly made of W, can be modified when it is heated excessively, making it more resistive.

The steps in making transistors on the second level $N_2$ that might consume a high thermal budget may for example include a dopant activation step by means of at least one high temperature thermal annealing. In this description, "high temperature" means a temperature of more than 500° C. This thermal annealing may be made using a laser L for example at a local temperature of the order of 1200° C. for several nanoseconds.

One or several epitaxy steps to form source/drain regions may also have a high thermal budget, particularly above 600° C.

The next step is to form another insulating layer 35, for example based on $SiO_2$, so as to cover the second level $N_2$ with components and particularly transistor $T_{21}$.

One or several openings 46 are then formed in this insulating layer 35. At least one opening 46 also called an "access well" passes through the insulating layer 35 formed above the semiconducting elements 9 and opens up on at least one semiconducting element.

Figure 1E:
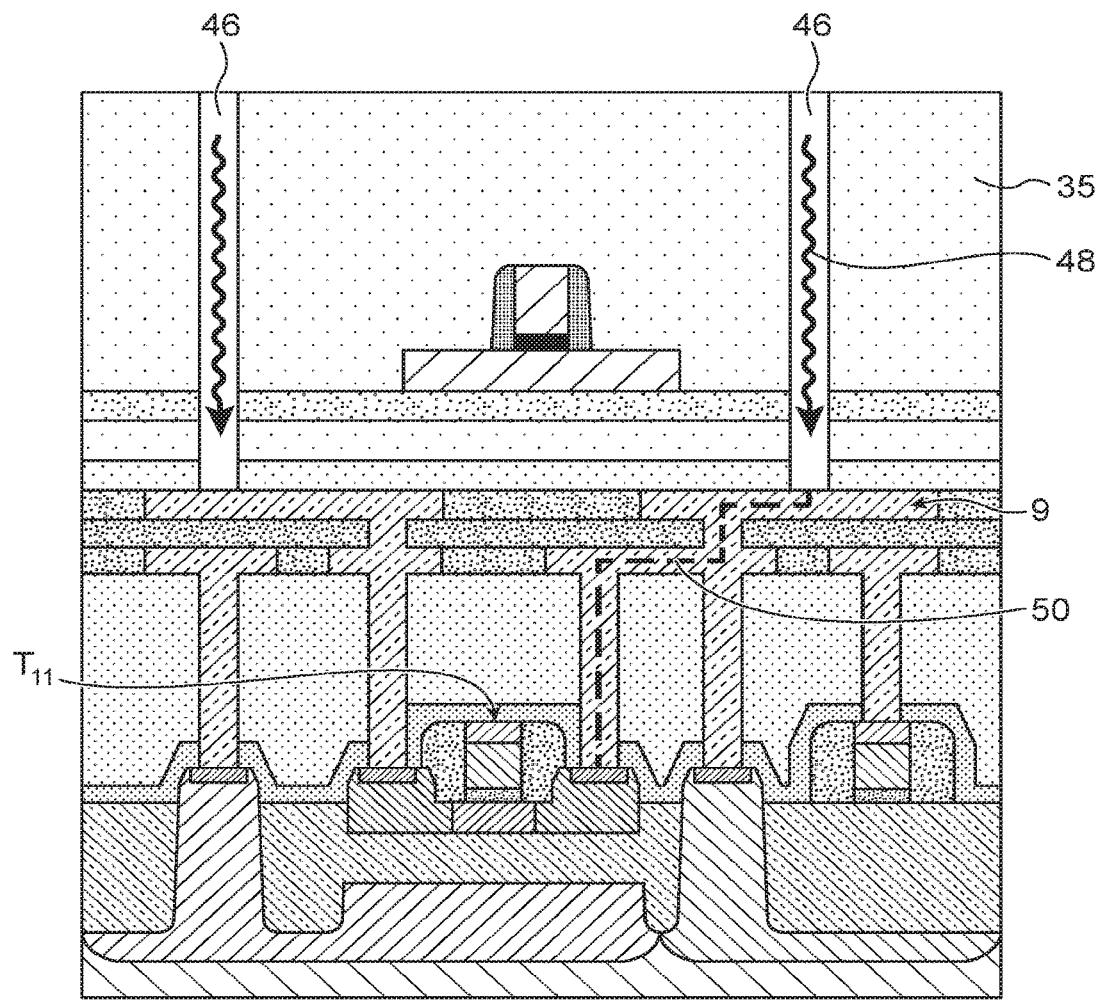

In the embodiment illustrated on FIG. 1E, the access well(s) 46 opening up on one or several semiconductors are formed so as to not to pass through the semiconducting layer or to not expose the second semiconducting layer.

A cleaning step is made after etching the access wells 46 so as firstly to remove residues related to etching, and also to remove an oxide that may be naturally present at the top of elements 9 or may have been formed during previous steps in the method. The presence of oxide can tend to inhibit a silicide formation step. This cleaning step may be done using an acid bath (HF) and/or by plasma (direct or remote) for example Ar, He, $NH_3/NF_3$. A waiting time of several hours, for example between 4 h and 8 h, is preferably included before the next deposit to prevent reoxidation of the semiconductor surface.

The next step is to deposit a metallic material 48 in the access well(s) (FIG. 1E).

The metallic material 48 is deposited on the semiconducting elements 9 so as to transform at least part of the semiconducting material from which these elements are made into a metal-semiconductor alloy.

The metallic material 48 may for example be deposited by "chemical vapour deposition" (CVD) or "physical vapour deposition" (PVD) or electroless deposition or by a process combining a PVD deposition following by an electroless deposition.

The deposited metallic material 48 may for example be Ni, particularly when the elements 9 were formed based on silicon. Nickel has the advantage that it can form an NiSi type alloy without the need to use a high thermal budget, the formation temperature of such an alloy being between 400° C. and 600° C. Secondly, for elements with very small dimensions and particularly smaller than 10 nm, the NiSi alloy has better electronic conductivity than elements made of metals such as Cu, W, Co.

According to another example, the deposited metallic material 48 may for example be Co, particularly when the elements 9 were formed based on silicon.

Cobalt has the advantage that it can form a $CoSi_2$ type alloy rich in silicon.

The fact of using an alloy with a high proportion of silicon relative to the metal makes it possible to make elements based on a metal-semiconductor alloy applying a relatively low mechanical stress on the remainder of the circuit.

The ratio between the atomic volume of the deposited metal and the atomic volume of the semiconducting material of the elements 9 is taken into account in determining the thickness of the metallic material 48 to be deposited, considering the total previously deposited volume of the semiconducting material 8 of the elements 9.

When it is required for example to form an NiSi alloy by deposition of Ni on Si, 1 volume unit of Ni is deposited for 1.81 volume units of Silicon.

After deposition of the metallic material 48, at least one annealing called silicidation annealing is done to form the alloy 58.

To form an NiSi alloy 58, annealing can be done at a temperature for example between 250° C. and 550° C. and preferably between 400° C. and 450° C. For this method, this annealing is done under an inert gas atmosphere such as Ar, or $N_2$, or He.

The annealing duration is adapted as a function of the annealing temperature and the dimensions of the elements 9. This annealing duration can be chosen considering particularly the maximum path length, also called the "silicidation distance" that a silicide distribution front must follow to silicide the elements 9. The propagation rate D0 of this front is also taken into account. FIG. 1E shows an example path 50 that a silicide diffusion front would follow to come into contact with a drain of the transistor $T_{11}$.

The propagation rate of a Silicon and Nickel alloy diffusion front may for example be of the order of $2.40E-5$ $m^2/s$ for an $Ni_2Si$ phase and for example of the order of $2.97E-5$ $m^2/s$ for an NiSi phase.

The formation rate is then considered: $K=Do \exp(-Ea/K_B T)$ in which $Ea=1.52$ eV for an $Ni_2Si$ phase and $Ea=1.62$ eV for an NiSi phase, where $K_B$ is Boltzmann's constant and T is the temperature.

The silicidation distance L may be estimated using the formula $L=(K \cdot t)^{1/2}$ where t is the silicidation duration.

Figure 8:
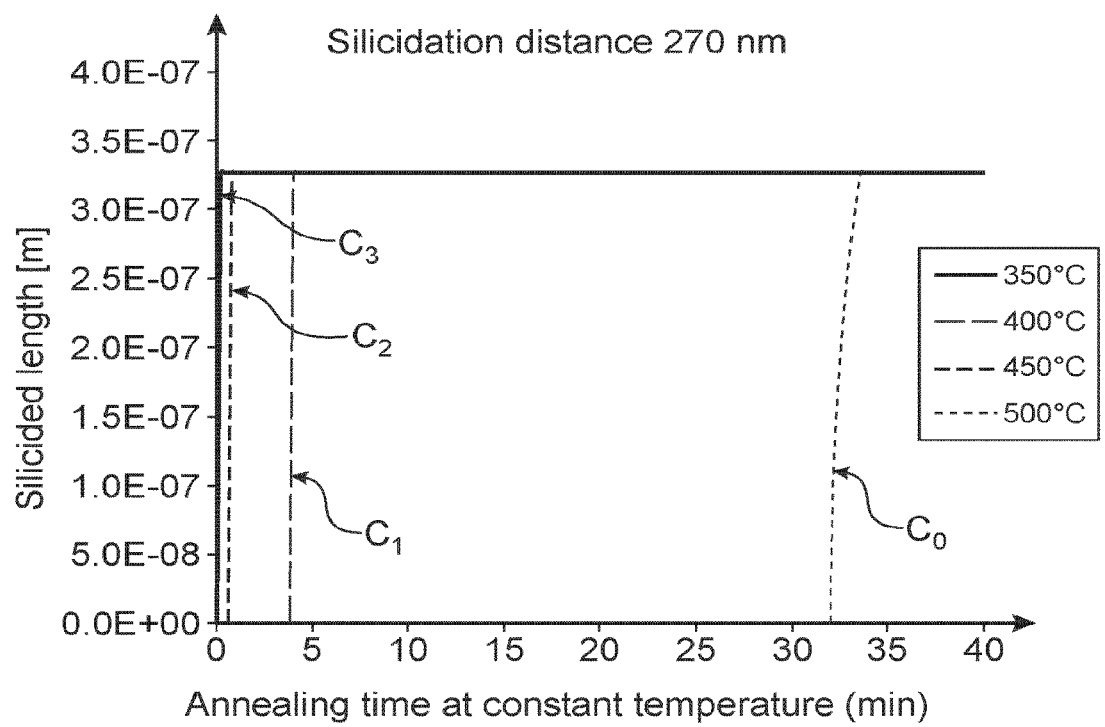
FIGS. 8 and 9 contain examples of time-temperature pairs to silicide a given semiconductor element over a given silicidation distance. Identical, similar or equivalent parts of the different figures have the same numeric references to facilitate comparison between the different figures.

FIG. 8 gives an estimate of the required annealing time for a chosen silicidation distance L of the order of 270 nm, for different annealing temperatures: 350° C. (curve $C_0$), 400° C. (curve $C_1$), 450° C. (curve $C_2$), 500° C. (curve $C_3$), if amorphous Si based elements 9 to be transformed into NiSi are considered.

Figure 9:
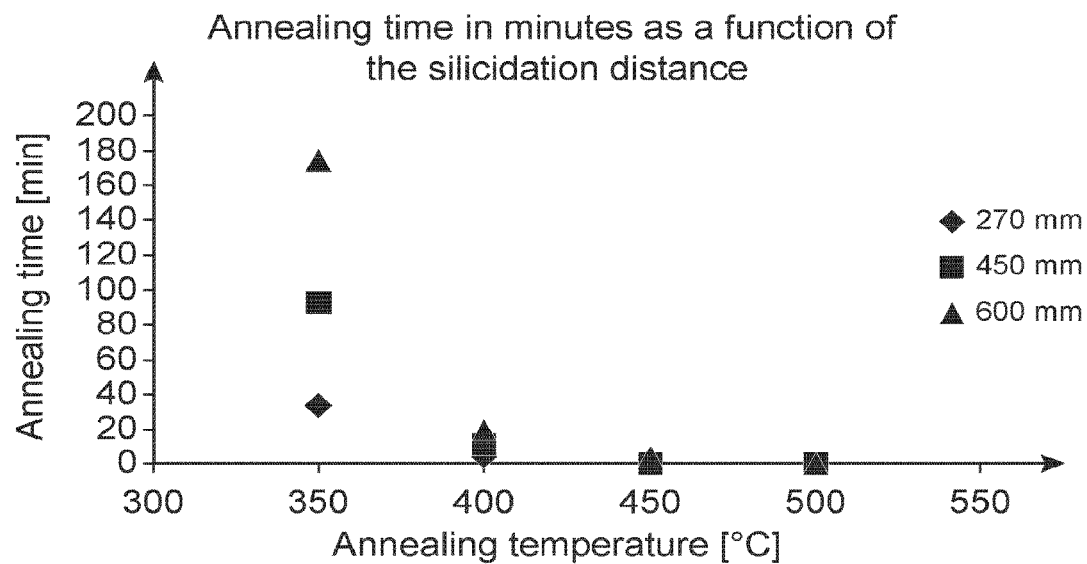

FIG. 9 shows an estimate of the annealing time necessary as a function of the annealing temperature for different silicidation distances considering elements 9 based on amorphous Si to be transformed into NiSi.

The following table contains examples of annealing durations for different (Silicidation distance–Annealing temperature) pairs.

| | Annealing temperature in minutes | | | |
|---|---|---|---|---|
| Silicidation distance | 350° C. | 400° C. | 450° C. | 500° C. |
| 270 nm | 34 | 4 | 0.8 | 0.2 |
| 450 nm | 93 | 11 | 1.8 | 0.4 |
| 600 nm | 174 | 20 | 3.2 | 0.8 |

The check on the size of grain joints of the alloy obtained can have an influence of the resistivity of elements 9. An alloy with a large grain joint size of can be beneficial for electrical conduction. The annealing duration can be increased to obtain a large grain joint size.

The orientation of grains can also have an influence on the resistivity of elements based on a metal-semiconductor alloy. This orientation depends particularly on the annealing temperature.

Figure 1F:
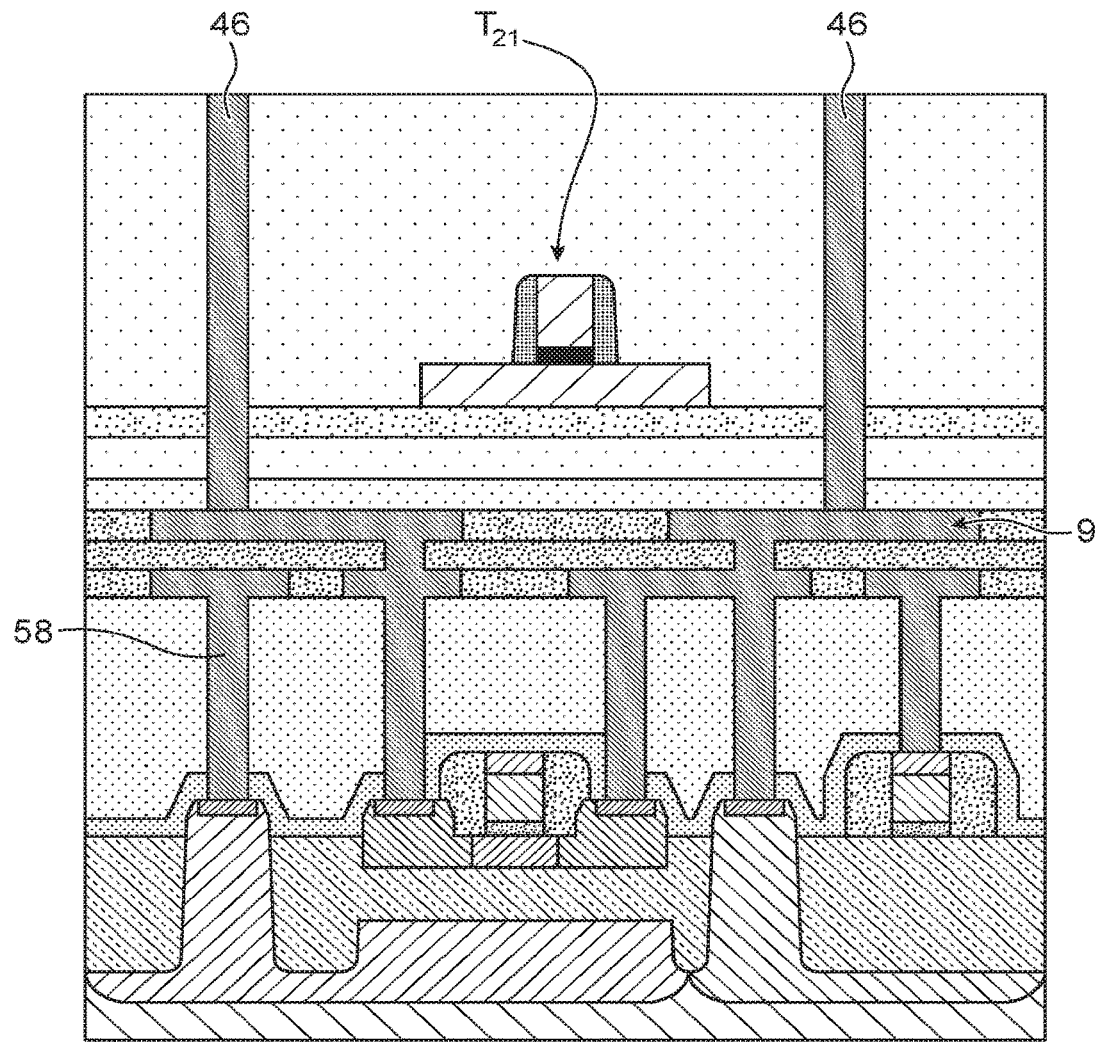

As illustrated on FIG. 1F, elements 9 based on a metal semiconductor alloy 58 that extend between two transistor levels $N_1$, $N_2$ and that could be in contact with first level transistors $N_1$ is obtained after the silicidation step. Conducting elements between levels $N_1$ and $N_2$ superposed on a 3D circuit are thus made without having submitted these conducting elements to an excessive thermal budget that could destroy them.

The fact that the access wells 46 do not open up and do not expose the second semiconducting layer makes it possible to form alloy based elements 58 without this alloy propagating into the second semiconducting layer.

Some connection elements of the circuit can be made from a material different other than a metal-semiconductor alloy.

Figure 1G:
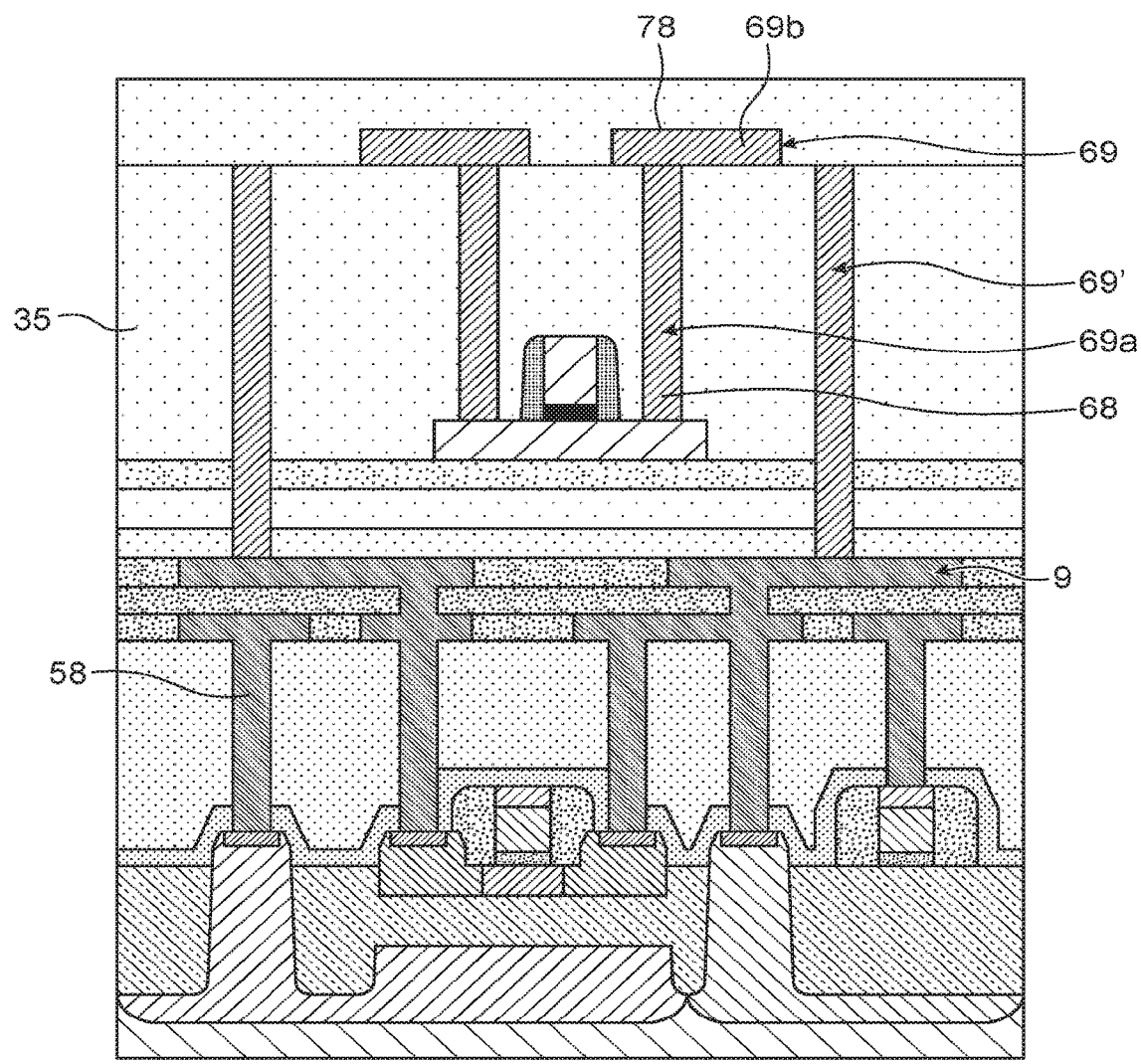

For example, FIG. 1G illustrates an embodiment of connection elements 69, 69' on the upper level $N_2$ that pass through the insulating layer 35 covering the transistor $T_{21}$ and in this case are formed based on metal.

Some connection elements 69 can be made in openings opening up on regions of the transistor $T_{21}$ at the upper level $N_2$, for example on a gate, source and drain region respectively.

Elements 69 in contact with the transistor $T_{21}$ on the upper level $N_2$ can be formed from a vertical lower portion 69a based on a metal 68 such as Tungsten and a horizontal upper portion 69b based on another metal 78 such as copper. Other connection elements 69' from the upper components level $N_2$ pass through the insulating layer 35 until coming into contact with the at least one element 9 formed from a metal-semiconductor alloy.

Figure 2:
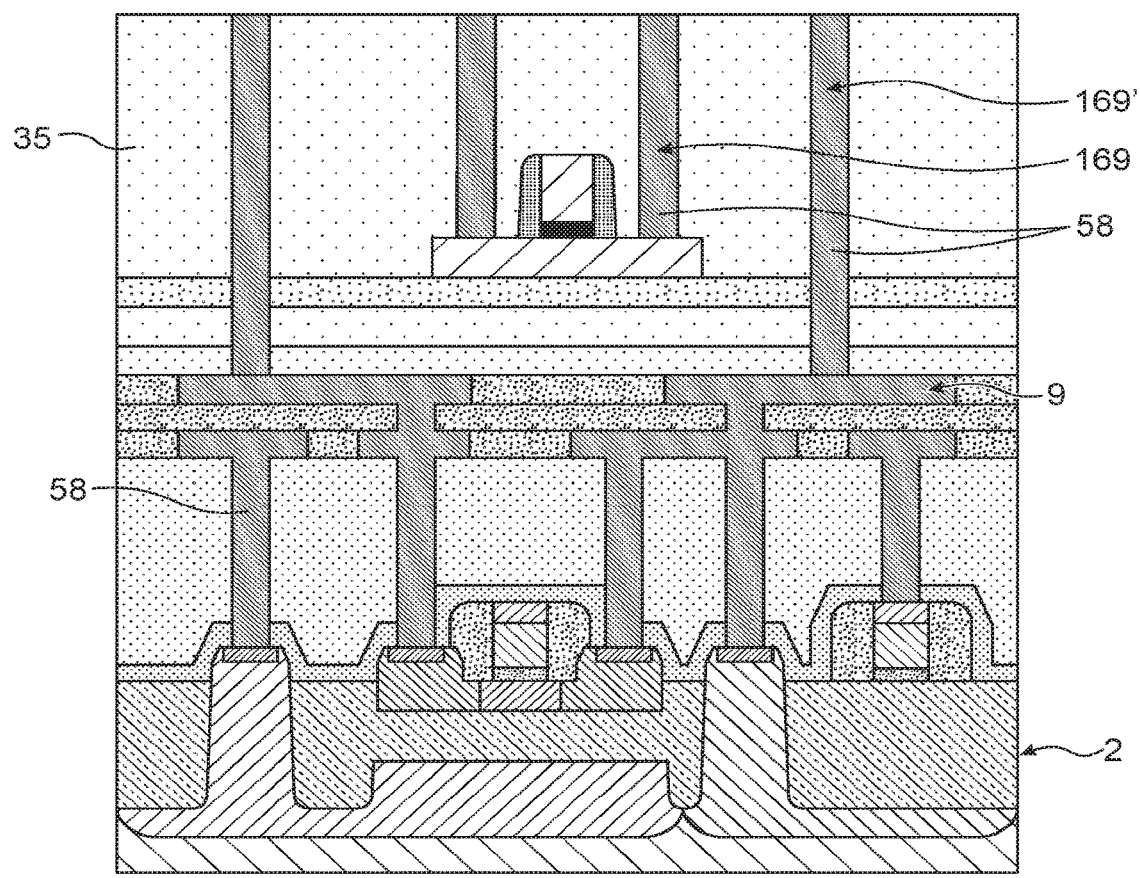
FIG. 2 illustrates a variant embodiment in which the connection elements of a higher stage of the circuit are formed from silicide with a metallic behaviour.

A variant embodiment of the example described above is illustrated on FIG. 2 and includes the production of connection elements 169' for the upper level $N_2$ also based on a metal-semiconductor alloy 58 formed by silicidation of a semiconducting material.

To achieve this, a semiconducting material 8 can also be deposited in the access well(s) 46 passing through the insulating layer 35 that covers transistor $T_{21}$ on the second level $N_{21}$ before deposition of the metal and silicidation described above with reference to FIG. 1E, this semiconducting material then being transformed into an alloy 58. Connection alloys 169 made of a metal-semiconductor alloy 58 can also be formed in openings exposing one or several regions of the transistor $T_{21}$ on the higher layer.

Figure 3:
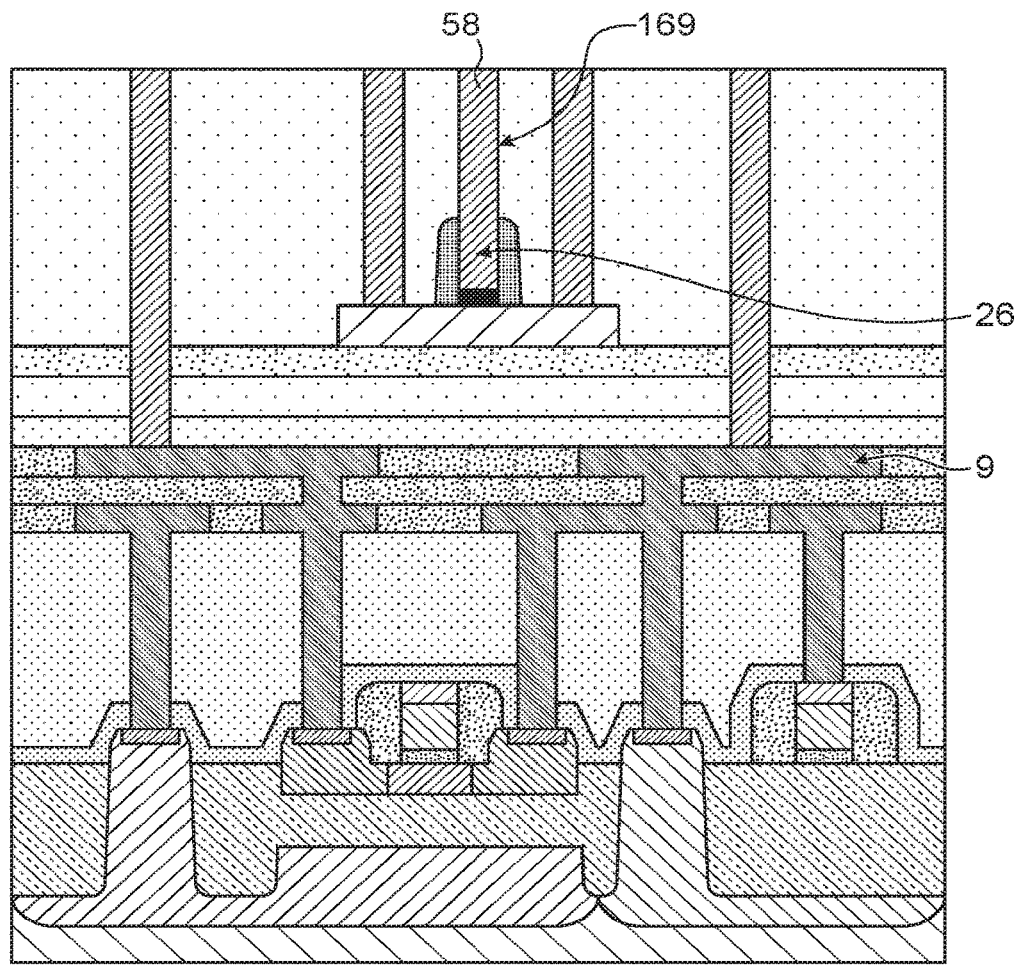
FIG. 3 illustrates a variant embodiment of the method for which at least one transistor gate in the 3D circuit is formed by silicidation at the same time as one or several circuit connection elements.

In the example embodiment in FIG. 3, a connection element 169 is formed made of a metal-semiconductor alloy 58 on the gate 26 of the transistor $T_{21}$ on the higher level, the gate 26 itself being made of a metal-semiconductor alloy.

Such a structure can be made by forming a gate pattern made of a semiconducting material, and then a semiconducting material and then a metal are deposited in an access well passing through the insulating layer 36 and exposing this gate made of a semiconducting material, and one or several annealing operations are then made so as to form a metal-semiconductor alloy. Formation of this alloy can propagate in the gate, to make a connection element 169 and a gate 26 on which this element 69 is supported, all made of a metal-semiconductor alloy.

Figure 4:
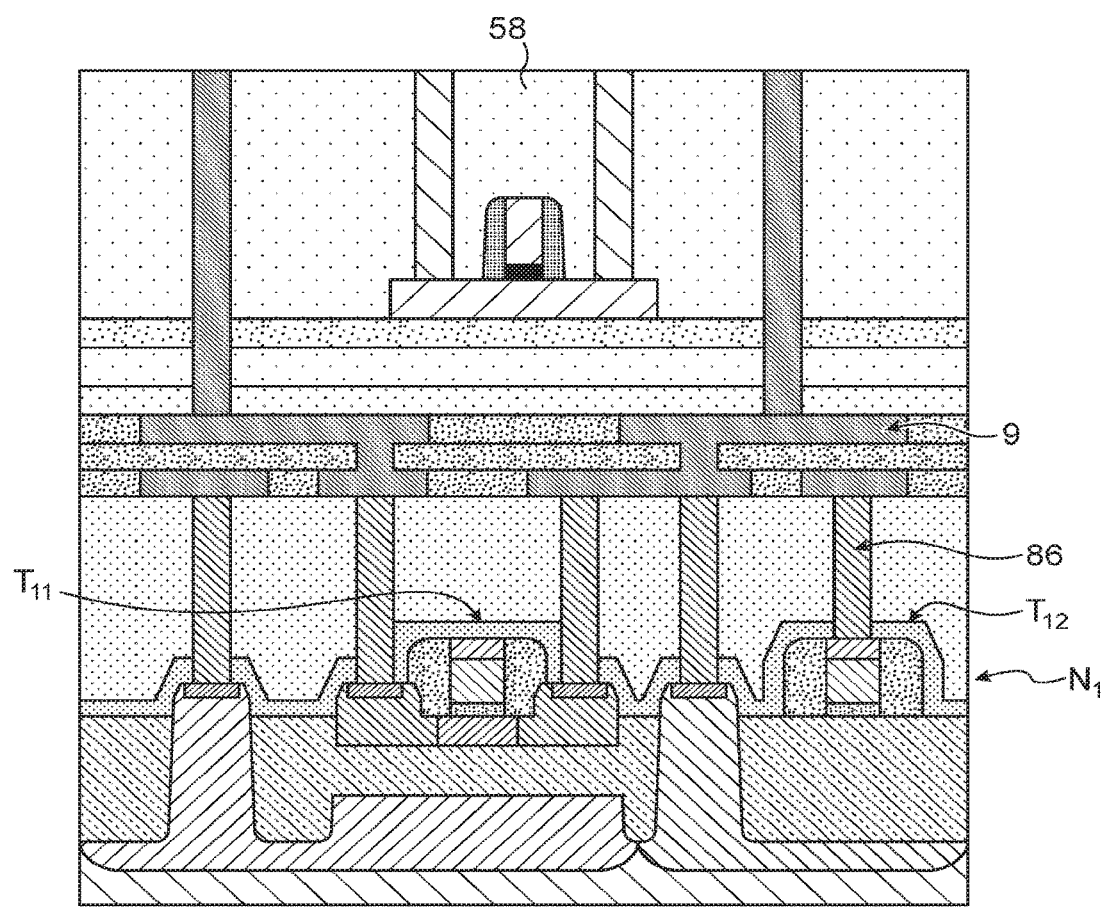
FIG. 4 illustrates a variant embodiment in which the connection elements based on metal silicide are formed on and in contact with metal pads that act as a barrier to propagation of silicide and connection zones to one or several transistors on a lower level.

FIG. 4 illustrates a variant embodiment in which the connection elements 9 based on a metal-semiconductor alloy 58 made between the lower transistor level $N_1$ and the upper transistor level $N_2$ are formed on and in contact with the pads 86, respectively. These pads 86 are themselves located on and in contact with transistors $T_{11}$, $T_{12}$ on the first level $N_1$.

The pads 86 are based on a conducting material, particularly metallic.

During the silicidation annealing step leading to transformation of the semiconducting material of the elements 9 into a metal-semiconductor alloy 58, propagation of the metal-semiconductor alloy takes place in semiconducting regions. The metal pads 86 can prevent unwanted propagation of metal-semiconductor alloy into the semiconducting layer in which the channels of first level transistors are made or into source and/or drain regions of transistor(s) in the lower level $N_1$.

The base metal from which the pads 11 are formed may for example be W.

According to another possible embodiment of the method, it would be possible to prevent unwanted diffusion or propagation of the metal-semiconductor alloy into transistors $T_{11}$, $T_{12}$ in the first level $N_1$, by forming a diffusion barrier layer 50 in openings 6 formed in the insulating layer 5 covering the first level $N_1$, before the connection elements based on the metal-semiconductor alloy are formed. The diffusion barrier layer 50 is conducting and is based on a metallic material, for example such as TiN or W.

Figure 5A:
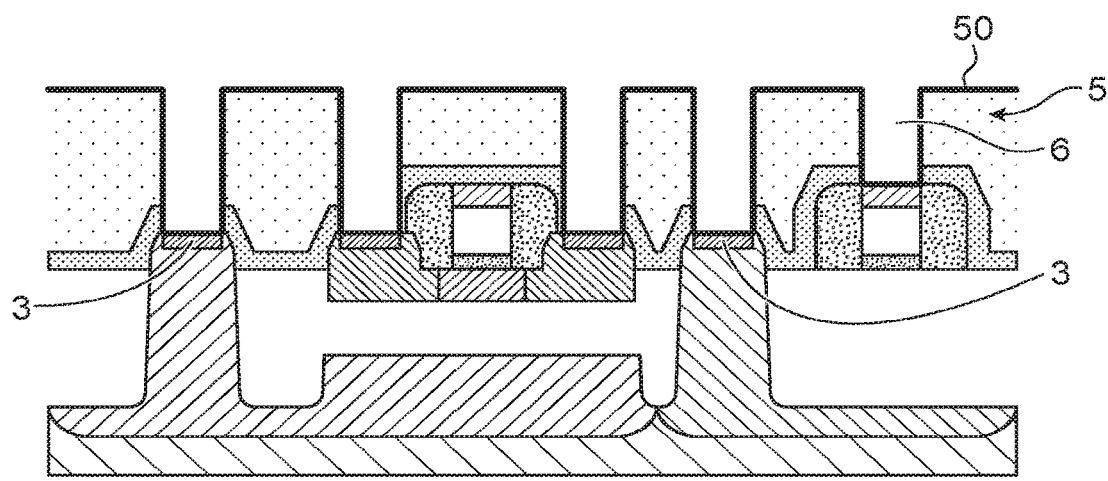
FIGS. 5A-5C illustrate an example embodiment in which the connection elements based on silicide in the 3D circuit are coated by a barrier conducting layer.

In the example embodiment in FIG. 5A, the opening(s) 6 expose(s) one or several corresponding silicided contact zones 3. The diffusion barrier layer 50 can thus cover and protect these contact zones 3. The barrier layer 50 can be made by conforming deposition on the insulating layer 5 so as to coat the bottom and side walls of the openings 6.

Figure 5B:
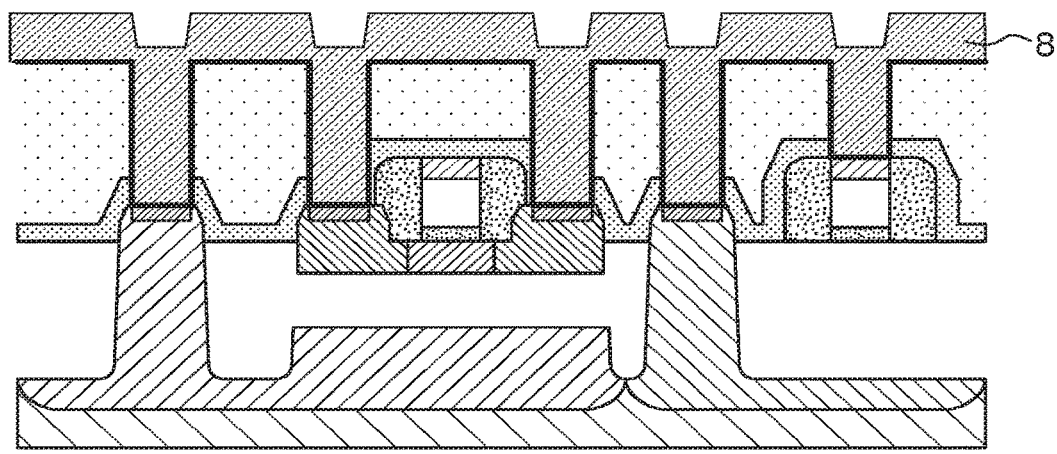

The semiconducting layer 8 filling in the openings 6 is then deposited (FIG. 5B). The semiconducting material 8 is then deposited so as to completely fill in the openings 6.

Figure 5C:
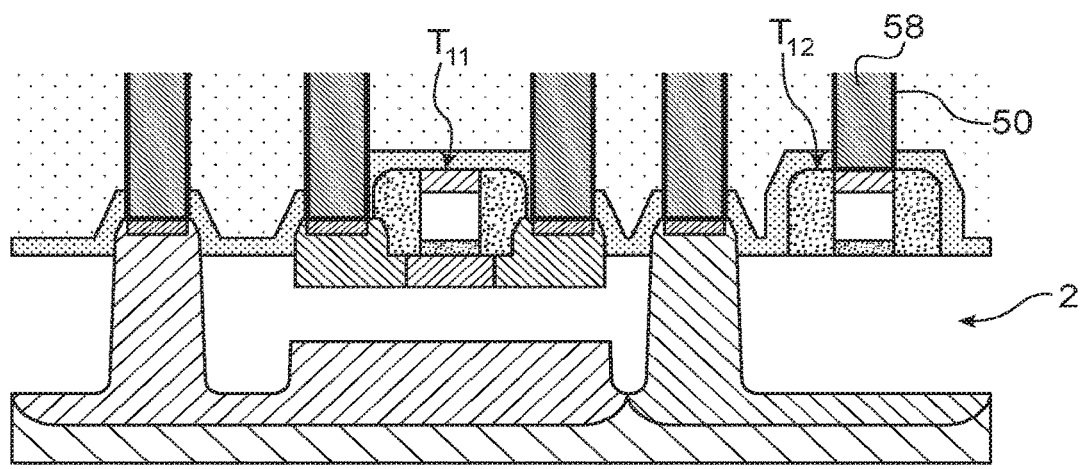
Figure 6:
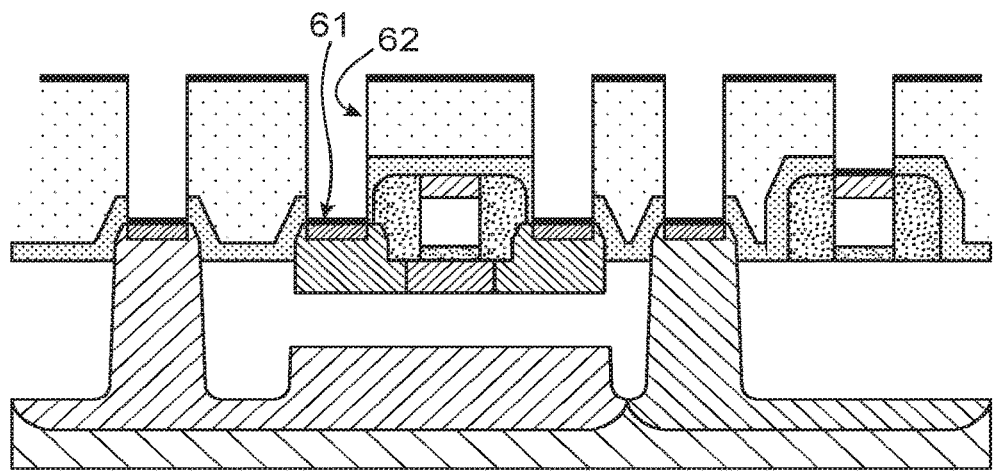
FIG. 6 illustrates a variant in which the diffusion barrier layer is formed by a PVD, CVD or ALD type technique.

Then, after a possible CMP type planarisation or polishing step to remove excess semiconducting material 8 projecting from the outlet of the openings 6, steps are performed to deposit metallic material and to anneal so as to form the metal-semiconductor alloy 58. The diffusion barrier layer 50 prevents any propagation of alloy into contact zones 3 or even into the semiconducting layer 2 from which one or several transistors $T_{11}$, $T_{12}$ in the first level are formed (FIG. 5C). A cleaning step is preferably carried out before the metallic layers are deposited, to remove any oxide thickness formed on the filling semiconducting material 8. Such a cleaning step may be done using an acid bath (HF) and/or by plasma (direct or remote) for example Ar, He, $NH_3/NF_3$.

According to one variant embodiment, the barrier layer 50 is formed particularly by a PVD type deposition to cover the bottom 61 of the openings 6 without covering the side walls 62 of the openings 6. As a result, it is possible to keep the diffusion barrier layer only where it is necessary to prevent propagation of the metal-semiconductor alloy into one or several semiconducting areas on transistor level $N_1$. The resistivity of the connection elements formed is thus limited.

A filling method combining a PVD deposition followed by an electroless deposition is possible to improve filling of access wells 46 by the metallic material 48 so as to form connection elements based on an alloy of a metal and semiconducting material.

Figure 7:
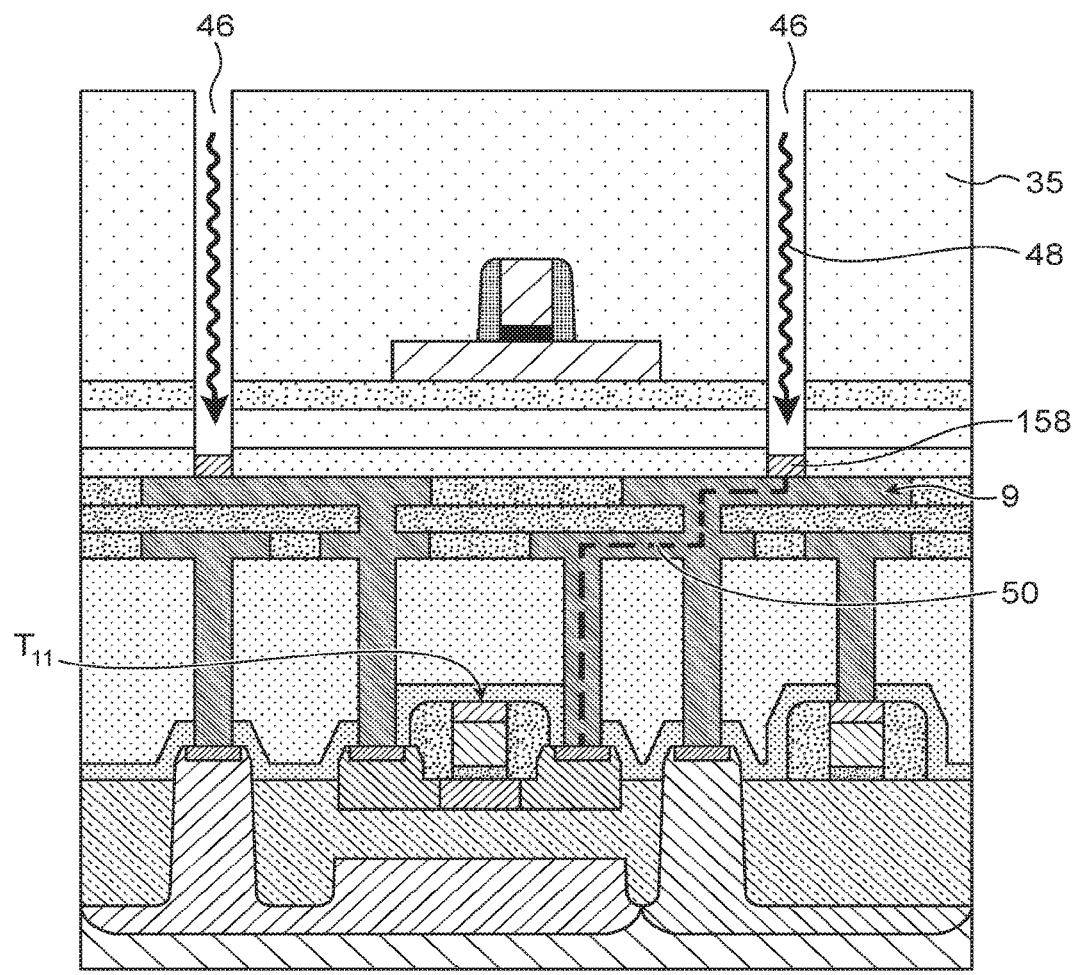
FIG. 7 illustrates an example embodiment in which doped semiconductor or metal blocks are formed by PVD prior to the deposition of metal for formation of the alloy.

An example embodiment of a variant of this type is shown in FIG. 7.

Blocks 158 based on a metallic material for example such as Ni or a doped semiconducting material such as for example doped polysilicon are firstly formed on elements 9 based on a semiconductor material by a PVD deposit to localise the material deposited at the bottom of the access well 46 without coating the side walls of this access well 46.

The access well 46 is then coated with a metallic material 48, this time by electroless deposition.

Combining these two techniques prevents the appearance of unfilled holes that could increase the resistance of connection elements based on metal-semiconductor alloy.

If the blocks 158 are based on a doped semiconducting material, this semiconducting material can be doped in situ in other words at the time of the deposition.

Doping can be done such that only an upper portion of the surface of blocks 158 with a thickness for example of between 2 and 10 nanometers is doped.

The invention claimed is:

1. A method for making one or several connection elements for an integrated circuit with superposed transistor levels, the method comprising:

a) forming one or several openings passing through a stack comprising at least one insulating layer above a first transistor on a given level, the first transistor being provided with a channel region located in a first semiconducting layer; then b) filling the opening(s) with a semiconducting material so as to form one or several elements based on the semiconducting material passing through the insulating layer;

c) forming a second semiconducting layer and a second transistor on the stack, the second semiconducting layer comprising a channel region of the second transistor on another level higher than the given level, the forming comprising at least high temperature annealing conducted at a temperature higher than 500° C.; then d) forming at least one access well to at least one element among the one or several elements based on the semiconducting material passing through the insulating layer, and then;

e) depositing a metallic material in the access well and applying a thermal annealing so as to form an alloy based on metal and semiconductor starting from said semiconducting material and said metallic material, so as to transform said element based on the semiconducting material into an interconnecting element based on the alloy of metal and semiconductor passing through the insulating layer.

2. The method according to claim 1, further comprising, after said one or several openings are formed and before the one or several openings are filled with the semiconducting material:
forming a conducting barrier layer coating a bottom of the opening(s) made in step a), the conducting barrier layer coating the bottom of said one or several openings forming a barrier to propagation of the alloy during formation of the alloy.

3. The method according to claim 2, wherein in the bottom of the opening(s) made in step a) exposing the first semiconducting layer, the conducting barrier layer formed previously in the step b) at the bottom of said one or several openings forming the barrier to propagation of the alloy in the first semiconducting layer during formation of said alloy in step e).

4. The method according to claim 1, wherein at least one opening formed in step a) comprises a bottom exposing a metal pad, the metal pad being placed on at least one region of the first semiconducting layer, the metal pad forming a barrier to propagation of the alloy in the first semiconducting layer during formation of said alloy in step e).

5. The method according to claim 2, wherein the barrier layer is based on a metallic material such as TiN or W.

6. The method according to claim 1, wherein the access well formed in step d) is arranged such that it does not pass through and it does not expose the second semiconducting layer.

7. The method according to claim 1, wherein at least one opening made in step a) comprises at least one vertical portion communicating with at least one horizontal portion, the horizontal portion extending parallel to the first semiconducting layer.

8. The method according to claim 1, wherein the opening(s) is or are filled with the semiconducting material so as to completely fill in the opening(s).

9. The method according to claim 1, wherein step d) includes forming the at least one access well to a gate of a transistor made of a semiconducting material, step e) comprising depositing metallic material on the gate and transforming at least one portion of the gate into a metal-semiconductor alloy.

10. The method according to claim 1, wherein critical dimension of the connection elements is less than 10 nm.

11. The method according to claim 1, wherein the semiconducting material is a low density material.

12. The method according to claim 9, wherein the metal-semiconductor alloy is based on Nickel and Silicon.

13. The method according to claim 1, further comprising cleaning the element(s) based on the semiconducting material, after step d) to form the access well and before step e) to deposit metallic material in the access well.

14. The method according to claim 1, further comprising CMP polishing after step b) to fill the opening(s) with the semiconducting material and before step c).

15. The method according to claim 1, further comprising, after step d) and before step e): forming a block of doped semiconducting material or metal by PVD at the bottom of the access well, said metallic material being deposited in step e) on the block of said doped semiconducting material or metal.

16. The method according to claim 12, wherein said thermal annealing to transform said element based on the semiconducting material into an element based on the alloy of metal and semiconductor being conducted at a temperature between 250° C. and 550° C.

17. A method for making one or several connection elements for an integrated circuit with superposed transistor levels, the method comprising:
a) forming one or several openings passing through a stack comprising at least one insulating layer above a first transistor on a given level, the first transistor being provided with a channel region located in a first semiconducting layer, then
  forming a conducting barrier layer coating a bottom of said opening(s);
b) filling the opening(s) with a semiconducting material so as to form one or several elements based on the semiconducting material passing through the insulating layer;
c) forming a second semiconducting layer on the stack, the second semiconducting layer comprising a channel region of a second transistor on another level higher than the given level; then
d) forming at least one access well to at least one element among the one or several elements based on the semiconducting material passing through the insulating layer; and
e) depositing a metallic material in the access well and applying a thermal annealing so as to form an alloy based on metal and semiconductor starting from said semiconducting material and said metallic material, so as to transform said element based on the semiconducting material into an interconnecting element based on the alloy of metal and semiconductor passing through the insulating layer, the conducting barrier layer coating the bottom of said opening(s) forming a barrier to propagation of the alloy during formation of the alloy.

18. The method according to claim 17, wherein said conducting barrier layer forms a barrier to propagation of the alloy in the first semiconducting layer during formation of said alloy in step e).

19. The method according to claim 17, wherein said conducting barrier layer is based on a metallic material such as TiN or W.

20. A method for making one or several connection elements for an integrated circuit with superposed transistor levels, the method comprising:
a) forming one or several openings passing through a stack comprising at least one insulating layer above a first transistor on a given level, the first transistor being provided with a channel region located in a first semiconducting layer; then
b) filling the opening(s) with a semiconducting material so as to form one or several elements based on the semiconducting material passing through the insulating layer, said semiconducting material entirely filling in said opening(s);
c) forming a second semiconducting layer on the stack, the second semiconducting layer comprising a channel region of a second transistor on another level higher than the given level;
d) forming at least one access well to at least one element among the one or several elements based on the semiconducting material passing through the insulating layer; and then
e) depositing a metallic material in the access well and applying a thermal annealing so as to form an alloy based on metal and semiconductor starting from said semiconducting material and said metallic material, so as to transform said element based on the semiconducting material into an interconnecting element based on the alloy of metal and semiconductor passing through the insulating layer.

* * * * *